US005862233A

United States Patent [19]

Poletti

[11] Patent Number: 5,862,233

[45] Date of Patent: Jan. 19, 1999

[54] WIDEBAND ASSISTED REVERBERATION SYSTEM

[75] Inventor: Mark Alister Poletti, Wellington, New Zealand

[73] Assignee: Industrial Research Limited, Wellington, New Zealand

[21] Appl. No.: 338,551

[22] PCT Filed: May 20, 1993

[86] PCT No.: PCT/NZ93/00041

§ 371 Date: Nov. 18, 1994

§ 102(e) Date: Nov. 18, 1994

[87] PCT Pub. No.: WO93/23847

PCT Pub. Date: Nov. 25, 1993

[30] Foreign Application Priority Data

May 20, 1992 [NZ] New Zealand ............................ 24286

[51] Int. Cl.$^{6}$ ........................................ H03G 3/00

[52] U.S. Cl. ........................................ 381/63; 381/61

[58] Field of Search ........................ 381/63, 61, 62, 381/66; 84/630

[56] References Cited

U.S. PATENT DOCUMENTS

| | | | |
|---|---|---|---|
| 5,109,419 | 4/1992 | Griesinger | 381/63 |
| 5,142,586 | 8/1992 | Berkhout | 381/63 |
| 5,297,210 | 3/1994 | Julstrom | 381/66 |

FOREIGN PATENT DOCUMENTS

| | | |
|---|---|---|
| 0335468 | 4/1989 | European Pat. Off. . |
| 4022217 | 6/1991 | Germany . |

OTHER PUBLICATIONS

Parkin, P.H. & Morgan, K., "Assisted Resonance in the Royal Festival Hall, London: 1965–1969," Journal of the Acoustical Society of America, Apr. 28, 1970, pp. 1025–1035.

DeKoning, S.H., "The MCR System—Multiple–Channel Amplification of Reverberation," Philips Tech. Rev. 41. No. 1, 1983/84, pp. 12–25.

Kawakami, F. & Shimizu, Y., "Active Field Control in Auditoria," Applied Accoustics 31 (1990), pp. 47–75.

Jones, M.H. & Fowweather, F., "Reverberation Reinforcement—an Electro–Acoustical System for Increasing the Reverberation Time of an Auditorium," Acoustica, Vo. 27 (1972), pp. 357–363.

Prinssen, Ir. W.C.J. M. & Holden, M., "System for Improved Acoustic Performance (SIAP)," Proc. I.O.A. vol. 14, Part 2 (1992) pp. 93–101.

Griesinger, David, "Improving Room Acoustics Through Time–Variant Synthetic Reverberation," 90th Convention Audio Engineering Society, Feb. 19–22, 1991.

Berkhout, A.J., DeVries, D., & Vogel, P., "Acoustic Control by Wave Field Synthesis," J. Acoust. Soc. Am. 93 (5), May 1993, pp. 2764–2778.

*Primary Examiner*—Minsun Oh Harvey
*Attorney, Agent, or Firm*—Clifford W. Browning; Woodard, Emhardt, Naughton, Moriarty & McNett

[57] ABSTRACT

A wideband assisted reverberation system has multiple microphones (M1–M3) to pick up reverberant sound in a room, multiple loudspeakers (L1–L3) to broadcast sound into the room, and a reverberation matrix connecting a similar bandwidth signal from the microphones (m) through reverberators to the loudspeakers (L). Preferably the reverberation matrix connects each microphone (m) through one or more reverberators to at least two loudspeakers (L) with cross-linking so that each loudspeaker (L) receives a signal comprising a sum of at least two reverberated microphone signals. Most preferably there is full cross-linking so that every microphone (m) through reverberators to every loudspeaker (L), so that each loudspeaker (L) receives a signal comprising a sum of reverberated microphone signals from every microphone (m).

7 Claims, 4 Drawing Sheets

"PRIOR ART"

WIDEBAND ASSISTED REVERBERATION SYSTEM

TECHNICAL FIELD

The invention relates to assisted reverberation systems. An assisted reverberation system is used to improve and control the acoustics of a concert hall or auditorium.

BACKGROUND ART

There are two fundamental types of assisted reverberation systems. The first is the In-Line System, in which the direct sound produced on stage by the performer(s) is picked up by one or more directional microphones, processed by feeding it through delays, filters and reverberators, and broadcast into the auditorium from several loudspeakers which may be at the front of the hall or distributed around the wall and ceiling. In an In-Line system acoustic feedback (via the auditorium) between the loudspeakers and microphones is not required for the system to work (hence the term in-line).

In-line systems minimise feedback between the loudspeakers and microphones by placing the microphones as close as practical to the performers, and by using microphones which have directional responses (eg cardioid, hyper-cardioid and supercardioid).

There are several examples of in-line systems in use today. The ERES (Early Reflected Energy System) product is designed to provide additional early reflections to a source by the use of a digital processor—see J. Jaffe and P Scarborough: "*Electronic architecture. Towards a better understanding of theory and practice*"93rd convention of the Audio Engine-ring Society, 1992, San Francisco (preprint 3382 (F-5)). The design philosophy of the system is that feedback between the system loudspeakers and microphones is undesirable since it produces colouration and possible instability.

The STAP (System for Improved Acoustic Performance) product is an in-line system which is designed to improve the acoustic performance of an auditorium taking its acoustic character into account, and without using acoustic feedback between the loudspeakers and microphones—see W. C. J. M. Prinsson and M. Holden, "*System for improved acoustic performance*", Proceedings of the Institute of Acoustics, Vol. 14, Part 2 pp 933–101, 1992. The system uses a number of supercardioid microphones placed close to the stage to detect the direct sound and some of the early reflected sound energy. Some reverberant energy is also detected, but this is smaller in amplitude than the direct sound. The microphone signals are processed and a number of loudspeakers are used to broadcast the processed sound into the room. The system makes no attempt to alter the room volume appreciably, because—as the designers state—this can lead to a difference between the visual and acoustic impression of the room's size. This phenomenon they termed dissociation. The SIAP system also adds some reverberation to the direct sound.

The ACS (Acoustic Control System) product attempts to create a new acoustic environment by detecting the direct wave field produced by the sound sources on-stage by the use of directional microphones, extrapolating the wave fields by signal processing, and rebroadcasting the extrapolated fields into the auditorium via arrays of loudspeakers—see A. J. Berkhout, "A holographic approach to acoustic control", J. Audio Engineering Society, vol. 36, no. 12, pp 977–995, 1988. The system offers enhancement of the reverberation time by convolving the direct sound with a simulated reflection sequence with a minimum of feedback from the loudspeakers.

The electroacoustic system produced by Lexicon uses a small number of cardioid microphones placed as close as possible to the source, a number of loudspeakers, and at least four time-varying reverberators between the microphones and loudspeakers—see U.S. Pat. No. 5,109,419 and D. Griesinger, "*Improving room acoustics through time-variant synthetic reverberation*", 90th convention of the Audio Engineering Society, 1991 Paris (preprint 3014 (B-2)). The system is thus in-line. Ideally the number of reverberators is equal to the product of the number of microphones and the number of loudspeakers. The use of directional microphones allows the level of the direct sound to be increased relative to the reverberant level, allowing the microphones to be spaced from the sound source while still receiving the direct sound at a higher level than the reverberant sound.

To summarise, all of the in-line systems discussed above seek to reduce or eliminate feedback between-the loudspeakers and microphones by using directional microphones placed near the sound source, where the direct sound field is dominant. It is assumed that feedback is undesirable since it leads to colouration of the sound field and possible instability. As a result of this design philosophy, in-line systems are non-reciprocal, ie they do not treat all sources in the room equally. A sound source at a position other than the stage, or away from positions covered by the directional microphones will not be processed by the system. This non-reciprocity of the in-line system compromises the two-ray nature of live performances. For example, the performers' aural impression of the audience response is not the same as the audiences impression of the performance.

The second type of assisted reverberation system is the Non-In-Line system, in which a number of omnidirectional microphones pick up the reverberant sound in the auditorium and broadcast it back into the auditorium via filters, amplifiers and loudspeakers (and in some variants of the system, via delays and reverberators—see below). The rebroadcast sound is added to the original sound in the auditorium, and the resulting sound is again picked up by the microphones and rebroadcast, and so on. The Non-In-Line system thus relies on the acoustic feedback between the loudspeakers and microphones for its operation (hence the term non-in-line).

In turn, there are two basic types of Non-In-Line assisted reverberation system. The first is a narrowband system, where the filter between the microphone and loudspeaker has a narrow bandwidth. This means that the channel is only assisting the reverberation in the auditorium over the narrow frequency range within the filter bandwidth. An example of a narrowband system is the Assisted Resonance system, developed by Parkin and Morgan and used in the Royal Festival Hall in London—see "*Assisted Resonance in the Royal Festival Hall.*", J. Acoust. Soc. Amer, vol 48, pp 1025–1035, 1970. The advantage of such a system is that the loop gain may be relatively high without causing difficulties due to instability. A disadvantage is that a separate channel is required for each frequency range where assistance is required.

The second form of Non-In-Line assisted reverberation system is the wideband system, where each channel has an operating frequency range which covers all or most of the audio range. In such a system the loop gains must be low, because the stability of a wideband system with high loop gains is difficult to maintain. An example of such a system is the Philips MCR ('Multiple Channel amplification of Reverberation') system, which is installed in several concert halls around the world, such as the POC Congress Centre in Eindhoven—see de Koning S. E., "*The MCR System*—

*Multiple Channel Amplification of Reverberation*", Phillips Tech. Rev., vol 41, pp 12–23, 1983/4.

There are several variants on the non-in-line systems described above. The Yamaha Assisted Acoustics System (AAS) is a combination in-line/non-in-line system. The non-in-line part consists of a small number of channels, each of which contains a finite impulse response (FIR) filter. This filter provides additional delayed versions of the microphone signal to be broadcast into the room, and is supposedly designed to smooth out the frequency response by placing additional peaks between the original peaks—see F. Kawakami and Y. Shimizu, "*Active Field Control in Auditoria*", Applied Acoustics, vol 31, pp 47–75, 1990. If this is accomplished then the loop gain may be kept quite high without causing undue colouration, and consequently the number of channels required for a reasonable increase in reverberation time is low. However, the design of the FIR filter is critical: the room transfer functions from each loudspeaker to each microphone must be measured and all FIR filters designed to match them. The FIR filter design can not be carried out individually since each filter affects the room response and hence the required response of the other FIR filters. Furthermore, the passive room transfer functions alter with room temperature, positioning of furniture and occupancy, and so the system must be made adaptive: ie the room transfer functions must be continually measured and the FIR filters updated at a reasonable rate. The system designers have acknowledged that there is currently no method of designing the FIR filters, and so the system cannot operate as it is intended to.

The in-line part of the AAS system consists of a number of microphones that pick up the direct sound, add a number of short echoes, and broadcast it via separate speakers. The in-line part of the AAS system is designed to control the early reflection sequence of the hall, which is important in defining the quality of the acoustics in the hall. An in-line system could easily be added to any existing non-in-line system to allow control of the early reflection sequence in the same way.

A simple variant on the non-in-line system was described by Jones and Powweather, "*Reverberation Reinforcement—An Electro Acoustic System for Increasing the Reverberation Time of an Auditorium*", Acustica, vol 31, pp 357–363, 1972. They improved the sound of the Renold Theatre in Manchester by picking up the sound transmitted from the hall into the space between the suspended ceiling and the roof with several microphones and broadcasting it back into the chamber. This system is a simple example of the use of a secondary acoustically coupled "room" in a feedback loop around a main auditorium for reverberation assistance.

To summarise, non-in-line assisted reverberation systems seek to enhance the reverberation time of an auditorium by using the feedback between a number of loudspeakers and microphones, rather than by trying to minimise it. The risk of instability is reduced to an acceptable level by using a number of microphone/loudspeaker channels and low loop gains, or higher gain, narrowband channels. Other techniques such as equalisation or time-variation may also be employed. The non-in-line system treats all sources in the room equally by using omnidirectional microphones which remain in the reverberant field of all sources. They therefore maintain the two-way, interactive nature of live performances. However, such systems are harder to build because of the colouration problem.

In-line and non-in-line systems may be differentiated by determining whether the microphones attempt to detect the direct sound from the Bound source (ie the performers on stage) or whether they detect the reverberant sound due to all sources in the room. This feature is most easily identified by the positioning of the microphones and whether they are directional or not. Direction&l microphones close to the stage produce an in-line system. Omnidirectional microphones distributed about the room produce a non-in-line system.

DISCLOSURE OF INVENTION

The present invention provides an improved or at least alternative form of non-in-line reverberation system.

In its simplest form in broad terms the invention comprises a wideband non-in-line assisted reverberation system, comprising:

multiple omnidirectional microphones to pick up reverberant sound in a room, multiple loudspeakers to broadcast sound into the room, and a reverberation matrix connecting a similar bandwidth signal from each microphone through a reverberator to a loudspeaker.

Preferably the reverberation matrix connects a similar bandwidth signal from each microphone through one or more reverberators to two or more separate loudspeakers, each of which receives a signal comprising one reverberated microphone signal.

More preferably the reverberation matrix connects a similar bandwidth signal from each microphone through one or more reverberators per microphone to one or more loudspeakers, each of which receives a signal comprising a sum of one or more reverberated microphone signals.

Very preferably the reverberation matrix connects a similar bandwidth signal from each microphone through one or more reverberators to at least two loudspeakers each of which receives a signal comprising a sum of at least two reverberated microphone signals.

Most preferably the reverberation matrix connects a similar bandwidth signal from every microphone through one or more reverberators to every loudspeaker, each of which receives a signal comprising a sum of reverberated microphone signals from every microphone.

In any of the above cases the reverberation matrix may connect at least eight microphones to at least eight loud speakers, or groups of at least eight microphones to groups of at least eight loudspeakers.

A maximum of N.K crosslinks between microphones and loudspeakers is achievable where N is the number of microphones and K the number of loud speakers, but it is possible that there are lees than N.K crosslink connections between the microphones and loudspeakers, provided that the output from at least one microphone is passed through at least two reverberators and the output of each reverberator is connected to a separate loudspeaker.

The system of the invention simulates placing a secondary room in a feedback loop around the main auditorium with no two-way acoustic coupling. The system of the invention allows the reverberation time in the room to be controlled independently of the steady state energy density by altering the apparent room volume.

BRIEF DESCRIPTION OF DRAWINGS

The invention will now be further described with reference to the accompanying drawings, by way of example and without intending to be limiting. In the drawings.

DESCRIPTION OF PREFERRED FORMS

Figure 1:
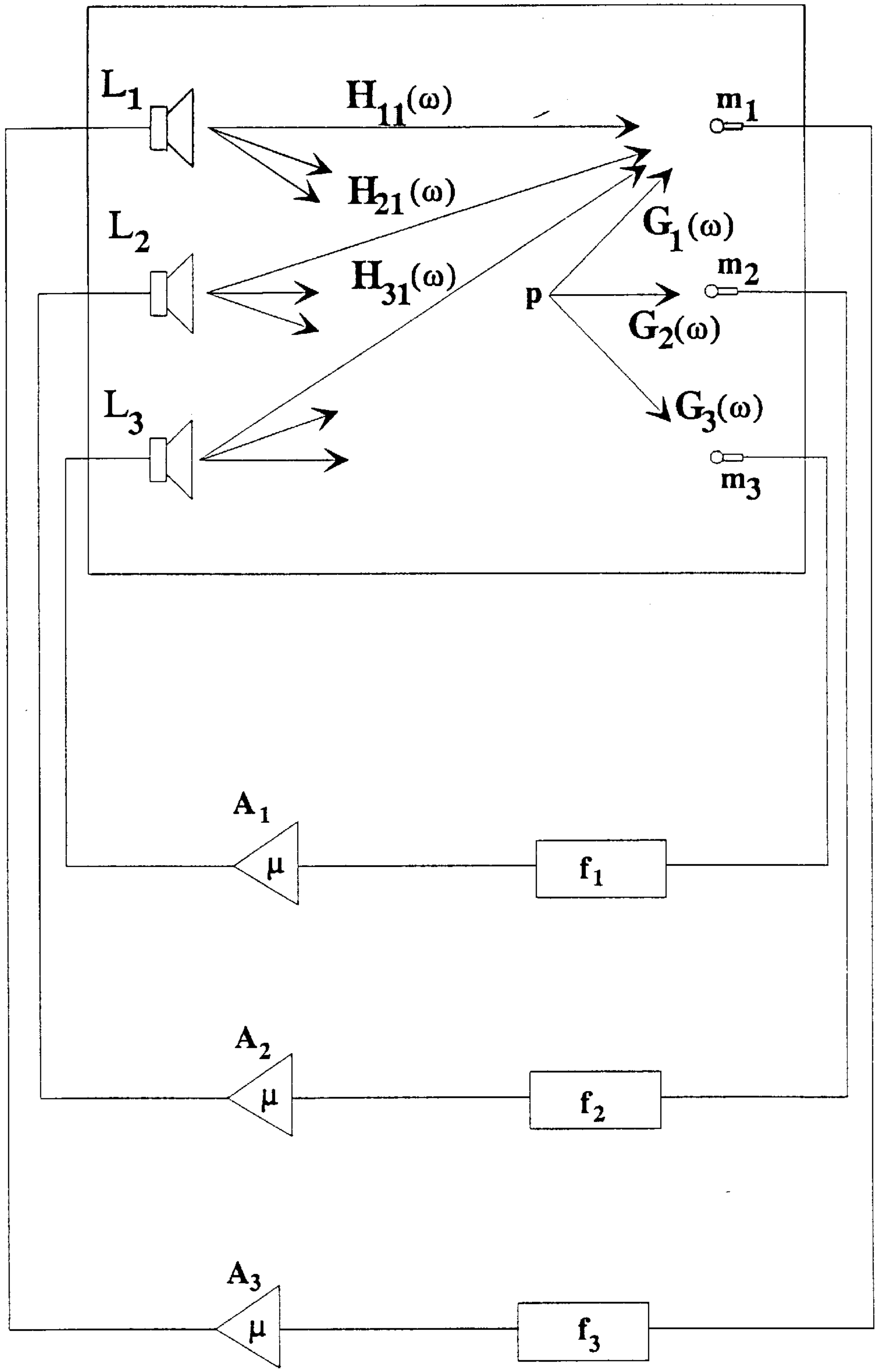
FIG. 1 shows a typical prior art wide band non-in-line assisted reverberation system.

FIG. 1 shows a-typical prior art wideband, N microphone, K loudspeaker, non-in-line assisted reverberation system (with N=K=3 for simplicity of the diagram). Each of microphones $m_1$, $m_2$ and $m_3$ picks up the reverberant sound in the auditorium and sends it via one of filters $f_1$, $f_2$ and $f_3$ and amplifiers $A_1$, $A_2$ and $A_3$ of gain $\mu$ to a respective single loudspeaker $L_1$, $L_2$ and $L_3$. In an MCR system the filters are used to tailor the loop gain as a function of frequency to get a reverberation time that varies slowly with frequency—they have no other appreciable effect on the system behaviour. In the Yamaha system the filters contain an additional FIR filter which provides extra discrete echoes, and whose responses are in theory chosen to minimise peaks in the overall response and allow higher loop gains, as discussed above. The filter block in both MCR and Yamaha systems may also contain extra processing to adjust the loop gain to avoid instability, and switching circuitry for testing and monitoring.

Figure 2:
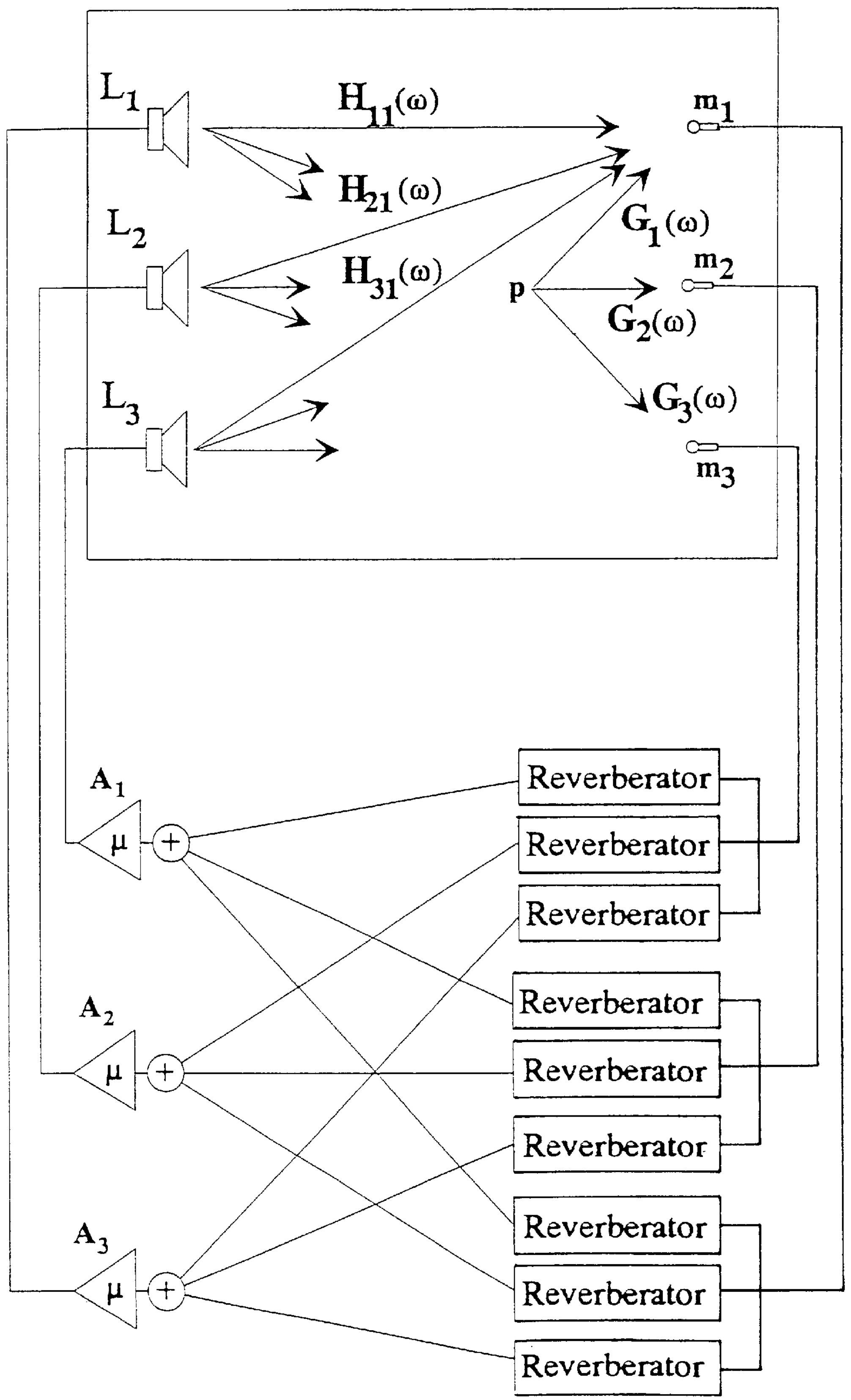
FIG. 2 shows a wide band non-in-line system of the invention.

FIG. 2 shows a wideband, N microphone, K loudspeaker non-in-line system of the invention. Each of microphones $m_1$, $m_2$ and $m_3$ picks up the reverberant sound in the auditorium. Each microphone signal is split into a number K of separate paths, and each 'copy' of the microphone signal is transmitted through a reverberator, (the reverberators typically have a similar reverberation time but may have a different reverberation time). Each microphone signal is connected to each of K loudspeakers through the reverberators, with the output of one reverberator from each microphone being connected to each of the amplifiers $A_1$ to $A_3$ and to loudspeakers $L_1$ to $L_3$ as shown I..e. one reverberator signal from each microphone is connected to each loudspeaker and each loudspeaker has connected to it the signal from each microphone, through a reverberator. In total there are N.X connections between the microphones and the loudspeakers.

The system of reverberators may be termed a 'reverberation matrix'. It simulates a secondary room placed in a feedback loop around the main auditorium. It can most easily be implemented using digital technology, but alternative electroacoustic technology, such as a reverberation plate with multiple inputs and outputs, may also be used.

While in FIG. 2 each microphone signal is split into K separate paths through K reverberators resulting in N.K connections to K amplifiers and loudspeakers, the microphone signals could be split into less than K paths and coupled over less than K reverberators i.e. each loudspeaker may have connected to it the signal from at least two microphones each through a reverberatory but be cross-linked with less than the total number of microphones. For example, in the system of FIG. 2 the reverberation matrix may split the signal from each of microphones $m_1$, $m_2$ and m, to feed two reverberators instead of three, and the reverberator output from microphone $m_1$ may then be connected to speakers $L_1$ and $L_3$, from microphone $m_2$ to speakers $L_1$ and $L_2$, and from microphone $m_1$ to speakers $L_2$ and $L_2$.

It can be shown that the system performance is governed by the mini-mum of N and K, and so systems of the invention where N=K are preferred.

In FIG. 2 each loudspeaker indicated by $L_1$, $L_2$ and $L_3$ could in fact consist of a group of two or more loudspeakers positioned around an auditorium.

In FIG. 2 the signal from the microphones is split prior to the reverberators but the same system can be implemented by passing the supply from each microphone through a single reverberator per microphone and then splitting the reverberated microphone signal to the loudspeakers.

FIG. 2 shows a system with three microphones, three loudspeakers, and three groups of three reverberators but as stated other arrangements are possible, of a single or two microphones, or four or five or more microphones, feeding one or two, or four or five or more loudspeakers or groups of loudspeakers, through one or two, or four or five or more groups of one, two, four or five or more reverberators for example.

The system of the invention may be used in combination with or be supplemented by any other assisted reverberation system such as an in-line system for example. An in-line system may be added to allow control of the early reflection sequence for example.

Very preferably the reverberators produce an Impulse response consisting of a number of echoes, with the density of echoes increasing with time. The response is typically perceived as a number of discernible discrete early echoes followed by a large number of echoes that are not perceived individually, rather they are perceived as 'reverberation'. Reverberators typically have an infinite impulse response, and the transfer function contains poles and zeros. It is however possible to produce a reverberator with a finite impulse response and a transfer function that contains only zeros. Such a reverberator would have a truncated impulse response that is zero after a certain time. The criterion that a reverberator must meet is the high density of echoes that are perceived as room reverberation.

Each element in the reverberation matrix may be denoted $X_{az}(\omega)$ (the transfer function from the nth microphone to the kth loudspeaker). The system analysis is described in terms of an N by K matrix of the $X_{nk}(\omega)$ and a K by N matrix of the original room transfer Functions between the kth loudspeaker and the nth microphone, denoted $H_{kn}(\omega)$. This analysis produces a vector equation for the transfer functions;

$$\overline{Y}(\omega)=[Y_1(\omega),Y_2(\omega), \ldots , Y_N(\omega)]^T \tag{1}$$

from a point in the original auditorium to each microphone as follows;

$$\tilde{Y}(\omega) = \frac{1}{V_0(\omega)}\tilde{V}(\omega) = [\tilde{I} - \mu\tilde{H}^T(\omega)\tilde{X}^T(\omega)]^{-1}\tilde{G}(\omega) \tag{2}$$

where $V_n(\omega)$ is the spectrum of the excitation signal input to a speaker at a point p in the room, $$\overline{v}(\omega) =[V_1(\omega),V_2(\omega), \ldots , V_N(\omega)]^5, \tag{3}$$

is a vector containing the spectra at each microphone with the system operating, $$\overline{G}(\omega)=[G_1(\omega),G_2(\omega), \ldots , G_N(\omega)]^T, \tag{4}$$

is a vector of the original transfer functions from p to each microphone with the system off, $$\tilde{X}(\omega) = \begin{bmatrix} X_{11}(\omega) & X_{12}(\omega) & X_{13}(\omega) & \ldots & X_{1K}(\omega) \\ X_{21}(\omega) & X_{22}(\omega) & X_{23}(\omega) & \ldots & X_{2K}(\omega) \\ X_{31}(\omega) & X_{32}(\omega) & X_{33}(\omega) & \ldots & X_{3K}(\omega) \\ \cdot & & & & \cdot \\ \cdot & & & & \cdot \\ \cdot & & & & \cdot \\ X_{N1}(\omega) & X_{N2}(\omega) & X_{N3}(\omega) & \ldots & X_{NK}(\omega) \end{bmatrix}, \tag{5}$$

is the matrix of reverberators, and $$\tilde{H}(\omega) = \begin{bmatrix} H_{11}(\omega) & H_{12}(\omega) & H_{13}(\omega) & \ldots & X_{1N}(\omega) \\ H_{21}(\omega) & H_{22}(\omega) & H_{23}(\omega) & \ldots & H_{2N}(\omega) \\ H_{31}(\omega) & H_{32}(\omega) & H_{33}(\omega) & \ldots & H_{3N}(\omega) \\ \cdot & & & & \cdot \\ \cdot & & & & \cdot \\ \cdot & & & & \cdot \\ H_{K1}(\omega) & H_{K2}(\omega) & H_{K3}(\omega) & \ldots & H_{KN}(\omega) \end{bmatrix}, \tag{6}$$

is the matrix of original transfer functions, $H_{kn}(\omega)$ from the kth loudspeaker to the nth microphone with the system off.

With the transfer functions to the system microphones derived, the general response to any other M receiver microphones in the room may be written as $$\tilde{Z}(\omega) = \frac{1}{V_0(\omega)}[\tilde{E}(\omega) + \mu\tilde{F}^T(\omega)\tilde{X}^T(\omega)[\tilde{I} - \mu\tilde{H}^T(\omega)\tilde{X}^T(\omega)]^{-1}\tilde{G}(\omega)] \tag{7}$$

where $$\overline{E}(\omega) = [E_1(\omega), E_2(\omega), \ldots, E_M(\omega)]^T, \tag{8}$$

is the original vector of transfer functions to the M receiver microphones in the room and $$\tilde{F}(\omega) = \begin{bmatrix} F_{11}(\omega) & F_{12}(\omega) & F_{13}(\omega) & \ldots & F_{1M}(\omega) \\ F_{21}(\omega) & F_{22}(\omega) & F_{23}(\omega) & \ldots & F_{2M}(\omega) \\ F_{31}(\omega) & F_{32}(\omega) & F_{33}(\omega) & \ldots & F_{3M}(\omega) \\ \cdot & & & & \cdot \\ \cdot & & & & \cdot \\ \cdot & & & & \cdot \\ F_{K1}(\omega) & F_{K2}(\omega) & F_{K3}(\omega) & \ldots & F_{KM}(\omega) \end{bmatrix} \tag{9}$$

is another matrix of room transfer functions from the K loudspeakers to the M receiver microphones.

To determine the steady state energy density level of the system for a constant input power, a power analysis of the system may be carried out assuming that each $E_n(\omega)$, $G_n(\omega)$, $X_{nk}(\omega)$, $H_{km}(\omega)$ and $F_{km}(\omega)$ has unity mean power gain and a flat locally averaged response. The mean power of the assisted system for an input power P is then given by $$P_{ass} = \frac{P}{1 - \mu^2 KN} \tag{10}$$

Since the power is proportional to the steady state energy density which is inversely proportional to the absorption, the absorption is reduced by a factor $(1-\mu^2KN)$. The reverberation time of a room is given approximately by $$T = .16\frac{V}{A} \tag{11}$$

where V equals the apparent room volume and A equals the apparent room absorption. Hence the change in absorption also increases the reverberation time by $1/(1-\mu^2KN)$. The MCR system has no cross coupling and produces a power and reverberation time increase of $1/(1-\mu^2N)$. The two systems produce the same energy density boost and reverberation time with similar colouration if the MCR system loop gain $\mu$ is increased by a factor $\sqrt{K}$.

The reverberation time of the assisted system is increased when the apparent room absorption is decreased. It is also increased if the apparent room volume is increased, from equation 1 1. The solution in equation 7 may be written as $$\tilde{Y}(\omega) = \tilde{E}(\omega) + \frac{\mu\tilde{F}^T(\omega)\tilde{X}^T(\omega)}{det[I - \mu\tilde{H}^T(\omega)\tilde{X}^T(\omega)]} Adj[I - \mu\tilde{H}^T(\omega)\tilde{X}^T(\omega)]\tilde{G}(\omega) \tag{12}$$

where det is the determinant of the matrix and Adj denotes the adjoint matrix.

For low loop gains the transfer function from a point in the room to the ith receiver microphone may be simplified by ignoring all squared and higher powers of $\mu$, and all $\mu$ terms in the adjoint;

$$Y_i(\omega) \approx E_i(\omega) + \frac{\mu \sum_{l=1}^{N}\sum_{k=1}^{K} G_l(\omega)X_{lk}(\omega)F_{ki}(\omega)}{1 - \mu\sum_{n=1}^{N}\sum_{k=1}^{K} X_{nk}(\omega)H_{kn}(\omega)} \tag{13}$$

Figure 3:
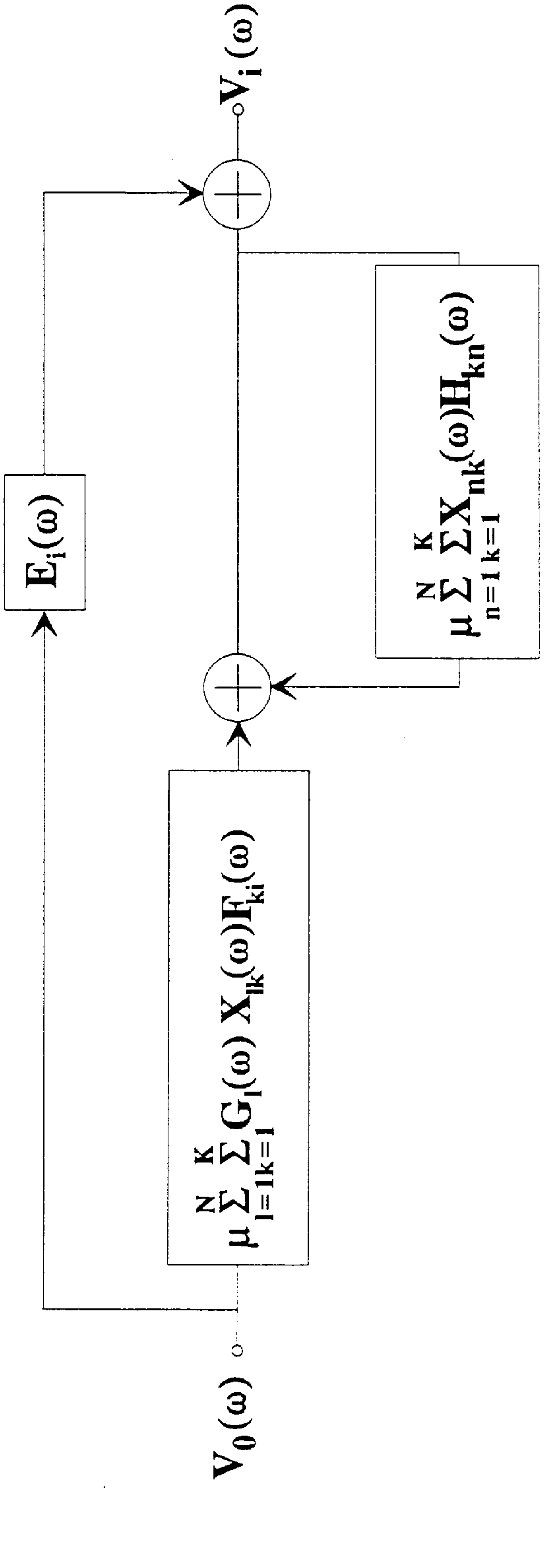
FIG. 3 is a block diagram of a simplified assisted reverberation transfer function for low loop gains.

Equation 13 reveals that the assisted system may be modelled as a sum of the original transfer function, $E_i(\omega)$, plus an additional transfer function consisting of the responses from the lth system microphone to the ith receiver microphone in series with a recursive feedback network, as shown in FIG. 3. The overall reverberation time may thus be increased by altering the reverberation time of the recursive network. This may be done by increasing $\mu$, which also alters the absorption, or independently of the absorption by altering the phase of the $X_{nk}(\omega)$ (This also increases the reverberation time of the feedforward section). The recursive filter resembles a simple comb filter, but has a more complicated feedback network than that of a pure delay. The reverberation time of a comb filter with delay $\tau$ and gain $\mu$ is equal to $-3\tau/\log(\mu)$. $T_{rec}$ may therefore be defined as;

$$T_{rec} = \frac{3\dfrac{\int \phi'_{rec}(\omega)M^2_{rec}(\omega)d\omega}{\int M^2_{rec}(\omega)d\omega}}{\log[\mu\overline{M}_{rec}]} \tag{14}$$

where $M_{rec}(\omega)$ is the overall magnitude (with mean $\overline{M}_{rec}$) and $-\phi_{rec}'(\omega)$ is the overall group delay of the feedback network. Thus the reverberation time, and hence the volume, may be independently controlled by altering the phase of the reverberators, $X_{nk}(\omega)$. This feature is not available in previous systems which either have no reverberators in the feedback loop as in the Philips MCR system—or which have a fixed acoustic room in the feedback loop which is not easily controlled. The Yamaha system will produce a limited change in apparent volume, but this cannot be arbitrarily altered since a) the FIR filters have a finite number of echoes which cannot be made arbitrarily long without producing unnaturalness such as flutter echoes (see Kawakami and Shimizu above), and b) the FIR filters also have to maintain stability at high loop gains and so their structure is constrained. The matrix of feedback reverberators introduced here has a considerably higher echo density so that flutter echoes problems are eliminated, and the fine structure of the reverberators has no bearing on the colouration of the system since the matrix is intended to be used in a system with a reasonably large number of microphones and loudspeakers and low loop gains. The reverberation matrix thus allows independent control of the apparent volume of the assisted auditorium without altering the perceived colouration by altering the reverberation time of the matrix without altering its mean gain.

Figure 4:
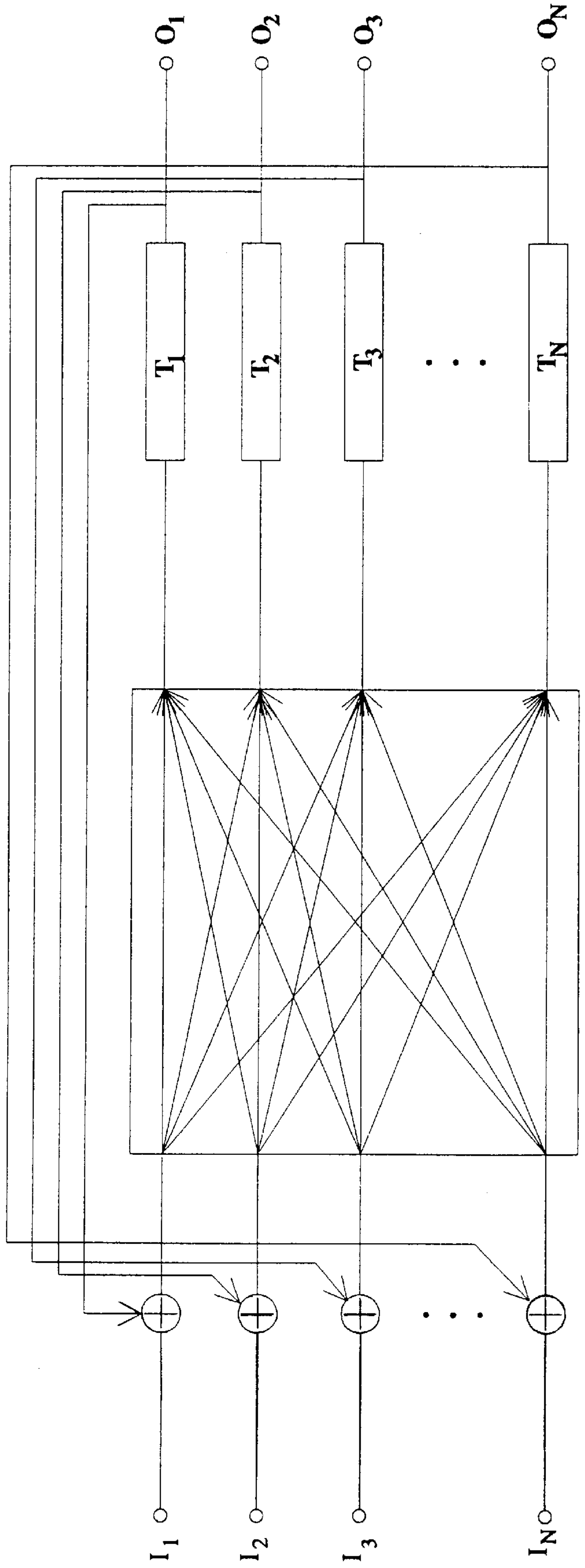
FIG. 4 shows a preferred form multi input, multi output N channel reverberator design of the invention.

FIG. 4 shows one possible implementation of an N channel input, N channel output reverberator. The N inputs $I_l$, to $I_N$ are cross coupled through an N by N gain matrix and the outputs are connected to N delay lines. The delay line outputs $O_l$ to $O_N$ are fed back and summed with the inputs. It can be shown that the system is unconditionally stable if the gain matrix is equal to an orthonormal matrix scaled by a gain $\mu$ which is less than one.

The foregoing describes the invention including preferred forms thereof. Alterations and modifications as will be obvious to those skilled in the art are intended to be incorporated in the scope thereof as defined in the claims.

I claim:

1. A wideband non-in-line assisted reverberation system, including:

multiple microphones positioned to pick up reverberant sound in a room, multiple loudspeakers to broadcast sound into the room, and a reverberation matrix connecting a similar bandwidth signal from each microphone through a reverberator, having an impulse response consisting of a number of echoes, the density of which increases over time, to a loudspeaker to thereby increase the apparent room volume.

2. A wideband non-in-line assisted reverberation system, including:

multiple microphones positioned to pick up reverberant sound in a room, multiple loudspeakers to broadcast sound into the room, and a reverberation matrix connecting a similar bandwidth signal from each microphone through one or more reverberators, having an impulse response consisting of a number of echoes, the density of which increases over time, to two or more separate loudspeakers and each of which receives a signal comprising one reverberated microphone signal to thereby increase the apparent room volume.

3. A wideband non-in-line assisted reverberation system, including multiple microphones positioned to pick up reverberant sound in a room, multiple loudspeakers to broadcast sound into the room, and a reverberation matrix connecting a similar bandwidth signal from each microphone through one or more reverberators, having an impulse response consisting of a number of echoes, the density of which increases over time, per microphone to one or more loudspeakers, each of which receives a signal comprising a sum of one or more reverberated microphone signals to thereby increase the apparent room volume.

4. A wideband non-in-line assisted reverberation system as claimed in claim 3, wherein the reverberation matrix connects a similar bandwidth signal from each microphone through one or more reverberators to at least two loudspeakers each of which recesses a signal comprising a sur, of at least two reverberated microphone signals.

5. A wideband non-in-line assisted reverberation system as claimed in claim 3, wherein the reverberation matrix connects a similar bandwidth signal from every microphone through one or more reverberators to every loudspeaker, each of which receives a signal comprising a sum of reverberated microphone signals from every microphone.

6. A wideband non-in-line assisted reverberation system as claimed in claim 4, wherein the reverberation matrix connects at least eight microphones to at least eight loudspeakers, or where groups of at least eight microphones are connected to groups of at least eight loudspeakers.

7. A wideband non-in-line assisted reverberation system as claimed in claim 6, wherein the reverberation matrix has impulse responses from any input to any output consisting of multiple echoes of increasing density with time.

* * * * *

UNITED STATES PATENT AND TRADEMARK OFFICE

CERTIFICATE OF CORRECTION

PATENT NO. : 5,862,233

DATED : January 19, 1999

INVENTOR(S) : POLETTI, Mark Alister

It is certified that error appears in the above-identified patent and that said Letters Patent is hereby corrected as shown below:

column 1, line 16, please change "wall" to --walls--.

column 1 line 29, please change "architecture." to --architecture:--.

column 1, line 31, please change "Engine-ring" to --Engineering--.

column 1, line 36, please change "STAP" to --SIAP--.

column 1, line 41, please change "Prinsson" to --Prinssen--.

column 2, line 17, please change "between-the" to --between the--.

column 2, line 28, please change "ray" to --way--.

column 2, line 67, please change "S. E.," to --S. H.,--.

column 3, line 41, please change "Powweather" to --Fowweather--.

column 4, line 1, please change "Bound" to --sound--.

column 4, line 5, please change "Direction&1" to --Directional--.

column 4, line 51, please change "lees" to --less--.

column 5, line 45, please change "N.X" to --N.K--.

column 5, line 11, please change "a-typical" to --a typical--.

column 5, line 41, please change "I..e." to --i.e.--.

UNITED STATES PATENT AND TRADEMARK OFFICE

CERTIFICATE OF CORRECTION

PATENT NO. : 5,862,233

DATED : January 19, 1999

INVENTOR(S) : POLETTI, Mark Alister

It is certified that error appears in the above-identified patent and that said Letters Patent is hereby corrected as shown below:

column 5, line 45, please change "N.X" to --N.K--.

column 5, line 59, please change "reverberatory" to --reverberator--.

column 5, line 63, please change "m," to --$m_3$--.

column 5, line 67, please change "$L_2$" to --$L_3$--.

column 6, line 2, please change "mini-mum" to --minimum--.

column 6, line 26, please change "Impulse" to --impulse--.

column 6, line 44, please change "Functions" to --functions--.

column 6, line 57, please change "$V_n$" to --$V_o$--.

column 6, line 61, please change "5" to --T--.

UNITED STATES PATENT AND TRADEMARK OFFICE

CERTIFICATE OF CORRECTION

PATENT NO. : 5,862,233

DATED : January 19, 1999

INVENTOR(S) : POLETTI, Mark Alister

It is certified that error appears in the above-identified patent and that said Letters Patent is hereby corrected as shown below:

column 7, line 15, please change "X" to --H--.

column 10, line 23, please change "recesses" to --receives--.

column 10, line 23, please change "sur" to --sum--.

Signed and Sealed this

Eighth Day of June, 1999

*Attest:*

Q. TODD DICKINSON

*Attesting Officer*

*Acting Commissioner of Patents and Trademarks*